United States Patent
Badzian et al.

(10) Patent No.: US 6,203,865 B1
(45) Date of Patent: Mar. 20, 2001

(54) LASER APPROACHES FOR DIAMOND SYNTHESIS

(75) Inventors: Andrzej R. Badzian; Rustum N. Roy, both of State College, PA (US); Pravin Mistry, Dearborn; Manuel C. Turchan, Northville, both of MI (US)

(73) Assignee: QQC, Inc., Dearborn, MI (US)

( * ) Notice: Subject to any disclaimer, the term of this patent is extended or adjusted under 35 U.S.C. 154(b) by 0 days.

(21) Appl. No.: 09/357,621

(22) Filed: Jul. 20, 1999

Related U.S. Application Data

(60) Provisional application No. 60/093,461, filed on Jul. 20, 1998.

(51) Int. Cl.[7] .............................. C23C 16/48; C23C 16/26
(52) U.S. Cl. ...................... 427/596; 427/249.8; 427/582
(58) Field of Search ................................ 427/596, 249.8, 427/582; 51/307; 407/119

(56) References Cited

U.S. PATENT DOCUMENTS

| | | | |
|---|---|---|---|
| 4,685,976 | * 8/1987 | Schachameyer et al. | 427/582 |
| 5,154,945 | * 10/1992 | Baldwin et al. | 427/596 |
| 5,308,651 | * 5/1994 | Ohta et al. | 427/582 |
| 5,891,522 | * 4/1999 | Olson | 427/309 |

FOREIGN PATENT DOCUMENTS 63-288991 * 11/1988 (JP) .

* cited by examiner

*Primary Examiner*—Shrive Beck
*Assistant Examiner*—Bret Chen
(74) *Attorney, Agent, or Firm*—Harness, Dickey & Pierce, P.L.C.

(57) ABSTRACT

A method for producing well-crystallized adherent diamond layers on WC—Co substrates. An array of focused laser beams is scanned across the WC—Co sample. Useful lasers include the excimer, YAG:Nd, and carbon dioxide types. The process is conducted in open air with carbon dioxide and nitrogen gases delivered for shrouding the substrate. A luminous plasma is found a few mm above the WC—Co insert. The duration of the deposition process in a typical case is approximately 40 s. This typically gives 20–40 $\mu$m thick coatings. The vertical growth rate is about 1 $\mu$m/s.

19 Claims, 6 Drawing Sheets

LASER APPROACHES FOR DIAMOND SYNTHESIS

This application claims Provisional to application Serial No. 60/093,461, filed Jul. 20, 1998.

TECHNICAL FIELD

The present invention is generally directed to diamond coatings. More particularly, the present invention is directed to diamond formation on a specific substrate material using laser energy.

BACKGROUND ART

The field of laser-solid interactions is now quite mature. The most ambitious undertaking of this kind is the thermonuclear-fusion project where usually lithium deutride or $D^2$ liquid or solid is driven by powerful UV excimer lasers. It has been very difficult to make the process of controlled fusion work; however, some hints of partial success have been reported.

Interaction of laser light with surfaces of more mundane solids can induce crystal phase transformations because of the high temperatures and pressure generated by shock waves. In addition to the p-t shock wave a gaseous plasma is often created at the solid-gas interface. In the vast majority of studies only a single wavelength laser is employed. If such a plasma is formed by multiplexed lasers, ranging in wavelength from UV to IR, it can obviously create a wide variety of chemically reactive species as well as very hot electrons. Such an environment is a unique set of conditions for crystal growth by condensation from the plasma.

Pulse Method—Radiation heating first from the sun, then from other energy sources for crystal growth purposes became popular in the 1960's. Focusing radiation from xenon lamps and $CO_2$ laser became new research tools for pulling crystals. Meanwhile, the pyrolysis of hydrocarbon gases over diamond surfaces led to codeposition of diamond and graphite and then to what has become the CVD process for diamond growth. The history of the struggle for the elimination of graphite inclusions is described in several papers, including: Angus J. C., Proceedings of the international School of Physics "Enrico Fermi" Course CXXXV, A. Paoletti and A. Tucciarone (Eds.), IOS Press, Amsterdam (1997), p. 1, 9; Badzian A. R. and DeVries R. C., *Mater. Res. Bull.*, 23 (1988) 385; and DeVries R. C., Badzian A. R. and Roy R., *Materi. Res. Soc. Bull.*, 21 (1996) 65. In the paper by DeVries et al., the photothermal approach to diamond synthesis is mentioned very briefly.

As early as 1967, Derjaguin and Fedoseev proposed a pulsed method for diamond growth. (See Derjaguin B. V. and Fedoseev D. V., *Surf. Coat. Technol.*, 38 (1989) 234) Light from a xenon lamp was focused on a diamond substrate to heat the surface. The heating and cooling were achieved by introduction of a chopper with windows to form pulses of light for heating and intervals for cooling. Pulses of heating produced periodic supersaturation of growth species in the vapor over the substrate which then deposited on cooling. On the basis of nucleation theory developed for diamond and graphite growth it has been suggested that both diamond (two dimensional) and graphite (three dimensional) nuclei are formed during the pulse, but graphite nuclei will have a tendency to disappear during the cooling interval because it will be more difficult for graphite nuclei to reach the critical radius. In this way, the selectivity for diamond growth was achieved. Isometric crystals (10–30 $\mu$m) and films (10–15 $\mu$m) were grown by this method. Process parameters were as follows: pulse duration $10^{-2}$ s, frequency 5 Hz, average temperature 950° C. and $H_2$ pressure 25 Torr. The temperature reached during pulses was around 1700° C.

Feasibility of high temperature growth has also been demonstrated with $CO_2$ laser (40 W) and NaCl optics. The deposition of diamond film from $CH_4$ at pressures of 1–10 Torr was conducted on diamond substrates. Diamond growth was conducted in the range 1100–1600° C. Only graphitic deposits were obtained for $C_2 H_2$ and $C_2 H_4$ gases. (See Fedoseev D. V., Varshavskaya I. G., Lavrent'ev A. V. and Derjaguin B. V., *Dokl. Akad. Nauk SSSR* (Chemistry), 4 (1977) 928.) In another set of experiments, a chopper was used to form pulses of radiation coming from a 10.6 $\mu$m $CO_2$ laser. (See Varshavskaya I. G. and Lavrent'ev A. V., *Arch. Nauk Material*, 7 (1986) 127.) The duration of the pulses was in the range $10^{-2}$ –500 s. Polycrystalline, black diamond films, up to 5 $\mu$m thick, were grown on diamond substrates. The diamond structure has been established by RHEED. The $CO_2$ laser provides surface heating and the gas phase stays cold, but the illumination enhances chemisorption, which in turn affects nucleation.

Homogeneous nucleation of diamond.—This refers to the theory of nucleation of diamond from the gas phase directed experiments on homogeneous nucleation. (See Fedoseev, D. V., Derjaguin B. V., Varshavskaya I. G. and Levrent'ev A. V., *Carbon*, 21 (1983) 243 and Fedoseev D. V., Derjaguin B. V. and Varshavskaya I. G., *Surf. Sci. Technol.*, 38 (1989)99.) The experiment was conducted in air. Drops of a liquid hydrocarbon fell down from a capillary tip of a burette filled with hexane or octane. A focused $CO_2$ laser beam struck perpendicularly the falling drops. A spark of plasma is formed in such situations. The drops evaporated and solid particles were formed. A variety of crystal and amorphous phases have been identified by electron diffraction, among them: diamond, $\beta$-carbine and graphite. Nucleation of diamond from the gas phase was demonstrated this way. This also supports the speculation for interstellar formation of diamond, which as agglomerates fell down to Earth and exists as carbonado.

2.3. Phase transformation in solids induced by laser beam.—Formation of metastable structures of metals by rapid cooling led Russian researchers to similar experiments with graphite. (See: Fedoseev D. V., Bukhovetz V. L., Varshavskaya I. G., Lavrent'ev A. V. and Derjaguin B. V., *Carbon*, 21 (1983) 237; Fedoseev D. V., Varshavskaya I. G., Lavrent'ev A. V. and Derjaguin B. V., *Powder Technol.*, 44 (1985) 125; and Fedoseev D. V., in *Synthetic Diamond*, edited by K. E. Spear and J. P. Dismukes (John Wiley and Sons, Inc., New York, N.Y.) 1994, pp. 41–56.) Positive results have been obtained upon heating carbon black above 2000 K and cooling at a rate of 10' K/s. The combination of heating and rapid cooling induced phase transformations in graphite. This rate of cooling is possible for 0.1 $\mu$m particles assuming radiation loss according to the Stefan-Boltzmann law.

The experiments were conducted with a $CO_2$ laser. Carbon black was poured through the focal point of the beam with a flux density up to 2000 W/cm$^2$. In an alternative experiment a laser beam was focused on a piece of polycrystalline graphite and cooling was conducted with the help of liquid nitrogen. The yields of these two processes were very low. Untransformed graphite material was etched out by cool air plasma. The residue was analyzed by electron diffraction. Cubic diamond, a- and $\beta$-carbine, chaoite and amorphous phases were determined.

In a similar manner the transformation of hexagonal-BN to cubic-BN and the so-called E-phase was demonstrated.

Interestingly the phase transformation of a-quartz to coesite and stishovite also takes place. The phase transformation induced by lasers seems to be a general phenomenon. It has been speculated that the displacement of thermally agitated carbon atoms from the equilibrium positions is relatively high at temperatures around 2500 K and compares to the length of both single (1.54 A) and double (1.42 A) bonds. Rapid cooling can quench different metastable forms.

However, it is fair to say that confidence in the described results was not excessive and it is certain that very little notice or follow up occurred by the world wide community. In spite of the discouraging background with respect to studies on the preparation of a diamond coating on a substrate, investigators persisted, and eventually it came to be known that conversion of quartz to coesite and stishovite required p-T and time conditions much more stringent than diamond formation.

With this in mind, investigators embarked on experiments to confirm and extend the Fedoseev and Derjaguin work. (See, for example, Alm M., DebRoy T., Roy R. and Breval E., *Appl. Phys. Lett.*, 53 (1988) 1687 and Breval E., Alm M., DebRoy T. and Roy R., *J. Mater. Sci. Lett.*, 9 (1990) 1071.) In the course of the next few years this was done and the inventors herein were able to make diamond and to get even higher-pressure phases (e.g., $PbO_2$ and $Fe_2N$ type structures of $SiO_2$) and were able in the case of $CaCO_3$ to prove that melting was not involved. (See Alm M. DebRoy T. and Roy R., *J. Am. Ceram. Soc.*, 73 (1990) 733.) There is no doubt about the high p-T conditions achieved, there is some evidence for melting in some cases.

N. Kikuchi et al. provided further confirmation for the Russian discovery giving a detailed description of experiments on carbon conversion with a 1 kW $CO_2$ laser conducted in He atmosphere. The Raman spectrum proved the formation of diamond particles. (See Kikuchi N., Ohsawa Y. and Suzuki I., *Diamond Relat. Mater.*, 2 (1993) 190.)

However, in spite of these efforts, excimer laser excitation did not result in diamond formation. Different types of carbon films, but not diamond, were deposited with laser ablation of carbon targets.

SUMMARY OF THE INVENTION

It is accordingly the general object of the present invention to provide a practical and reliable method by which to apply a diamond coating to a substrate.

It is an additional object of the present invention to provide such a method which includes providing an array of multiple lasers.

Still a further object of the present invention is to provide such a method in which two of the lasers are excimer lasers.

Yet an additional object of the present invention is to provide such a method which uses three different lasers.

An additional object of the present invention is to provide such a method which uses two different gases in conjunction with the lasers.

Still an additional object of the present invention is to provide such a method which effects the creation of a plasma about the surface of the substrate.

These and other objects are achieved by the method of the present invention which discloses a process which is capable of producing well-crystallized adherent diamond layers on WC—Co substrates. According to the method employed in the present invention, a set of focused laser beams is scanned across the WC—Co sample. Useful lasers include the excimer, YAG:Nd, and carbon dioxide types. The process is conducted in open air with carbon dioxide and nitrogen gases delivered for shrouding the substrate. A luminous plasma is found a few mm above the WC—Co insert. The duration of the deposition process in a typical case is approximately 40 s. This typically gives 20–40 $\mu$m thick coatings. The vertical growth rate is about 1 $\mu$m/s.

BRIEF DESCRIPTION OF THE FIGURES

The present invention will be more fully understood by reference to the following detailed description of the preferred embodiments of the present invention when read in conjunction with the accompanying drawings, in which.

DETAILED DESCRIPTION OF THE PREFERRED EMBODIMENT

The drawings disclose the preferred embodiment of the present invention. While the configurations according to the illustrated embodiment are preferred, it is envisioned that alternate configurations of the present invention may be adopted without deviating from the invention as portrayed. The preferred embodiment is discussed hereafter.

Preparation of diamond coatings.—Laser plasma growth of diamond was discovered while experimenting on surface modification processes applied to a variety of alloys and metals such as the nitriding of titanium. The essence of this discovery is that a set of multiplexed lasers has been applied for the first time to solids and resulted not only in changing the solid, but in specific cases of film deposition. Until now only one-laser systems have been used: $CO_2$ laser for photothermal processes and UV excimer laser for photochemical and for the usual laser ablation photolytic processes. (See Eden J. G., *Photochemical Vapor Deposition* (John Wiley and Sons, New York, N.Y.) 1992, pp. 5– 46.) The method disclosed in the present invention brings these two processes together using high-power lasers as are necessary to form the requisite plasma and to effect surface melting in large specimens.

The Process of Diamond Coating and Samples Created Therefrom

Figure 1A:
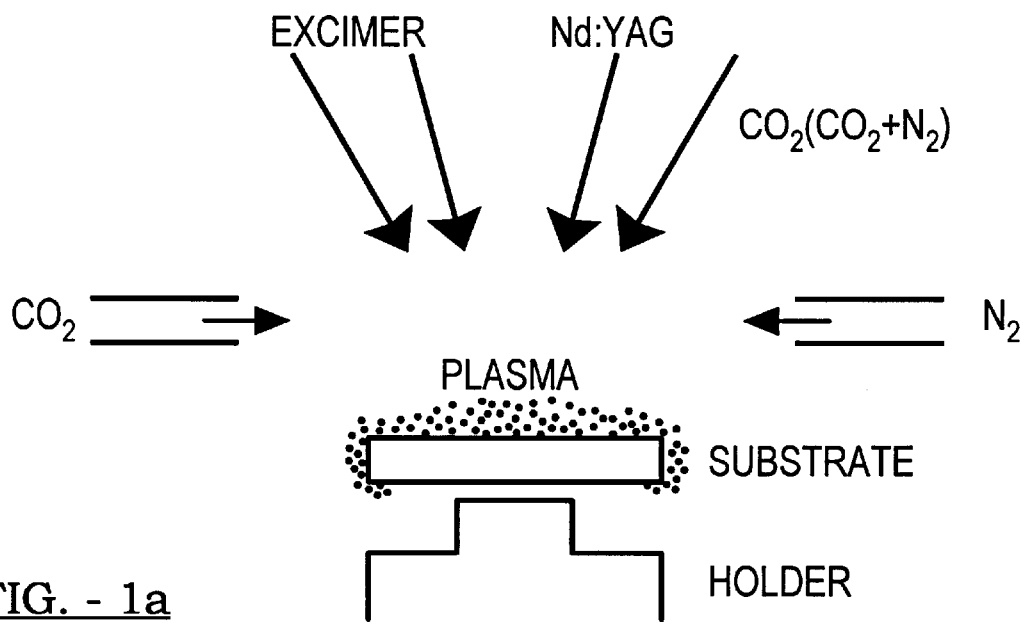
FIG. 1*a* is a schematic illustration of the process according to the present invention.

The schematic for the process is shown in FIG. 1a. In general, a set of focused laser beams is scanned across the WC—Co sample 1×2 cm.

Figure 1B:
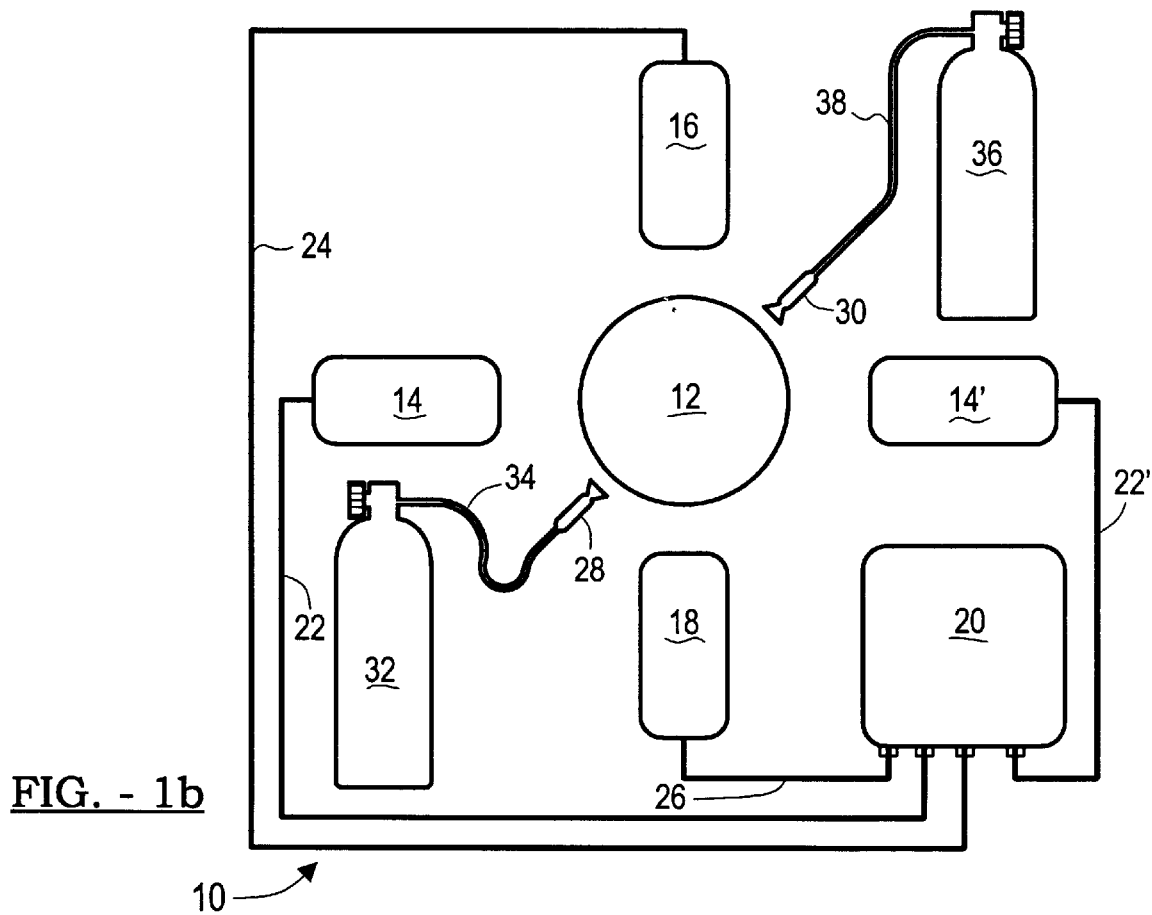
FIG. 1*b* is a plan view of a sample preparation station for fabricating the film-coated sample used for investigation in the present invention.

More particularly, and with respect to FIG. 1b, this figure illustrates a plan view of a sample preparation station, generally illustrated as 10, which was established for the preparation of a substrate for study and application in the present invention. A substrate support 12 is centrally disposed surrounded by an array of lasers. The lasers of choice include two excimer lasers 14, 14', one YAG:Nd laser 16, and one $CO_2$ laser 18. An alternate array of lasers having a different composition may be substituted for the described array, provided substantially the same results are achieved. However, these particular lasers were selected after due experimentation as having sufficient power to ignite the plasma which engulfs the substrate as set forth hereinafter.

A CPU 20 is provided for selectively operating the lasers 14, 14', 16, and 18 according to a prepared program. The excimer lasers 14, 14' are operatively associated with the CPU 20 via a pair of cables 22, 22'. The YAG:Nd laser 16 is operatively associated with the CPU 20 via a cable 24. The $CO_2$ laser 18 is operatively associated with the CPU 20 via a cable 26.

The station is established in an open air environment. (This was found to work for the selected WC—Co substrate material.) An array of gas jets 28, 30 is also disposed around the support 12. The gas jet 28 is operatively associated with a source of $N_2$ gas 32 via a gas conduit 34. The gas jet 30 is operatively associated with a source of $CO_2$ gas 36 via a gas conduit 38.

A sample substrate (not shown) was selected and placed on the substrate support 12. The selected samples were WC—Co inserts for cutting tools generally having widths of about 15 mm although it is to be understood that a variety of sample substrates could be selected. Once the sample substrate was placed on the support 12, selected quantities of the $N_2$ and $CO_2$ gases were delivered to shroud the substrate radially. No hydrogen is involved. The lasers 14, 14' 16, and 18 were then activated and were are operated in their pulsing modes as directed by the program of the CPU 20. The focused lasers 14, 14', 16, and 18 were guided by drive motors (not shown) to move across the substrate surface in a programmed manner as dictated by the CPU 20.

During the operation, a luminous plasma is created a few mm above the surface of the substrate which itself undergoes surface melting. The sequence of the laser pulse width and pulse frequency are adjusted as elements of the process parameters. The duration of the deposition process is generally about 40 s, and this length of time was employed in the preparation of the test sample. (Normally it takes about 40 s to coat the WC—Co insert with an area of 1.5 $cm^2$.) During this time the growth rate approaches 1 $\mu$m/s and the resulting diamond film was shown to have a thicknesses of between 20 and 40 $\mu$m. Of course, it is to be understood that variations of the parameters including laser time and pulse rate effect variations of the growth rate and resulting film thickness. (The sequence of laser pulse width and pulse frequency are valuable process parameters.)

Plasma Characteristics

The laser plasma appears to contain a wide variety of species created by photothermal and photochemical reactions and excitations for the mixture of $Co_2$, $N_2$, $O_2$ and the C+(W, Co) vapors. Some vapors no doubt play a role as photosensitizers and absorbers.

Surface Morphology of the Coatings

Figure 2:
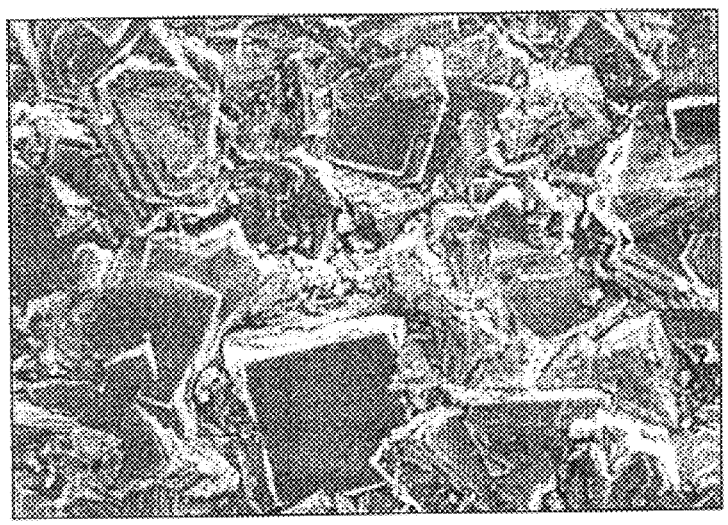
FIG. 2 is a secondary-electron image of the top surface of a diamond film with the bar corresponding to 10 $\mu$m.
Figure 3:
FIG. 3 is a secondary-electron image of fractured diamond film, 25 $\mu$m thick, on WC—Co with the bar corresponding to 10 $\mu$m.

Diamond coatings prepared according to the above-described process were found to have polycrystalline structure. Crystal grains sizes are typically 10–20/$\mu$m. The largest grain observed was 200 $\mu$m. Depending on the samples, crystal forms related to octahedra, cubes and intermediates are seen on images represented in FIG. 2 which illustrates a secondary electron image of the top surface of the diamond film formed on a substrate according to the present method. The bar corresponds to 10 $\mu$m. As may be readily seen, the cubes have top surface flat and side surfaces rough. FIG. 3 illustrates a secondary electron image of fractured diamond film, 25 $\mu$m thick, on WC—Co. The bar corresponds to 10 $\mu$m. Cross-sections of a coating in FIG. 3 show intragranular fracture. At the interface with WC—Co diamond penetrates between WC grains. The top surface with well-formed (111) faces shows features similar to CVD diamonds like macrosteps in FIG. 4 which is a backscattered-electron image of the top surface of diamond film prepared in accordance with the present invention. The white dots correspond to a W—Co—C phase. The bar is 10 $\mu$m. (For a related discussion, see Mistry, P., Turchan, M. C., Liu, S., Granse, G. O., Baurmann, T., and Shara, M. G., Innov. Mater Res., 1 (1996) 193.)

Figure 4:
FIG. 4 is a backscattered-electron image of the top surface of diamond film with white dots corresponding to a W—Co—C phase and with the bar being 10 $\mu$m.

Chemical composition.—Chemical analyses were performed using electron microprobe, X-ray photoelectron spectroscopy (XPS) and Auger electron microscopy. Carbon was identified as being the main component of the coatings. In addition, the electron microprobe detected substantial amounts of W and Co in the diamond films. The X-ray W L$\alpha$ signal was four times above the background and the Co K$\alpha$ signal was two times above background counting. The distribution of these two elements was uniform across the film thickness as measured on the cross-section. The concentration of W in the film was estimated as 0.2 wt %. XPS detected some oxygen after 1 min sputtering with Ar. Furthermore, particles of a W—Co(C) phase (average 1 $\mu$m) were found to be spread over the top surface of the coating. Reference may be had here to FIG. 4, previously discussed. The particles are presumably a result of condensation of metals from the vapor phase. These particles are a characteristic signature of coatings derived from the method of the present invention.

Figure 5:
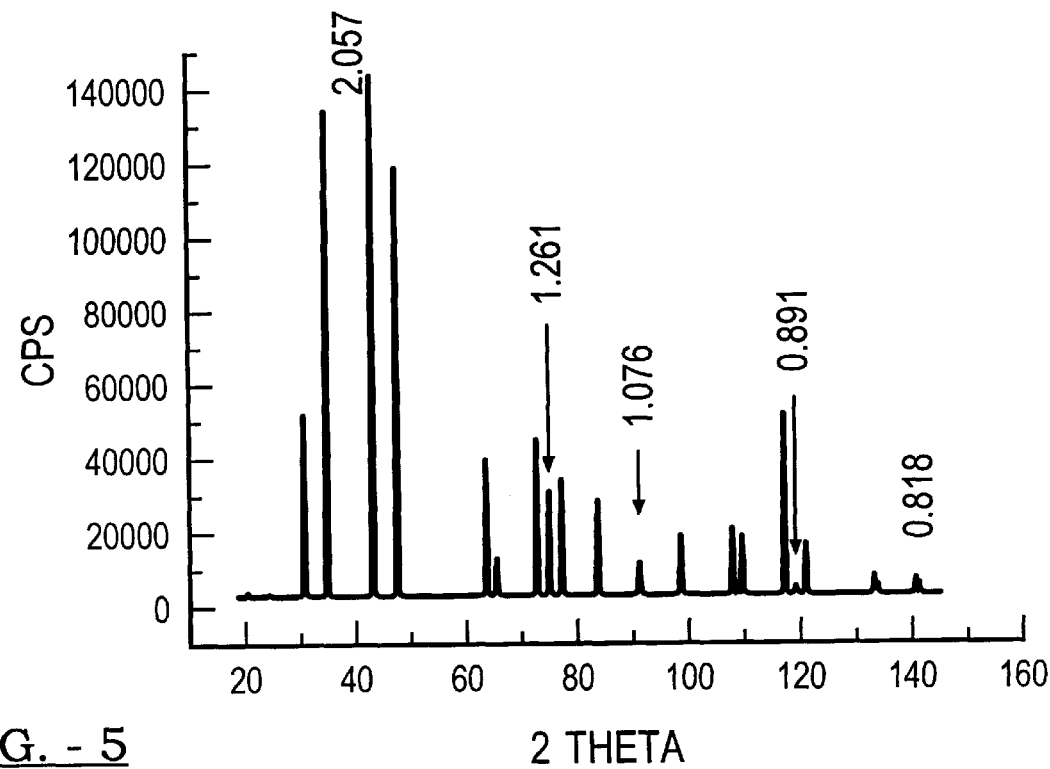
FIG. 5 is an X-ray diffractogram of diamond film on a WC—Co substrate.

Crystal structure.—X-ray diffractions from diamond films on WC—Co substrate have been obtained with Cu K$\alpha$ radiation and with the help of a diffractometer set to Bragg-Brentano focusing. As illustrated in FIG. 5, the diffractogram is composed exclusively of peaks of diamond and WC. Cubic diamond lines are listed below in Table I.

Figure 6:
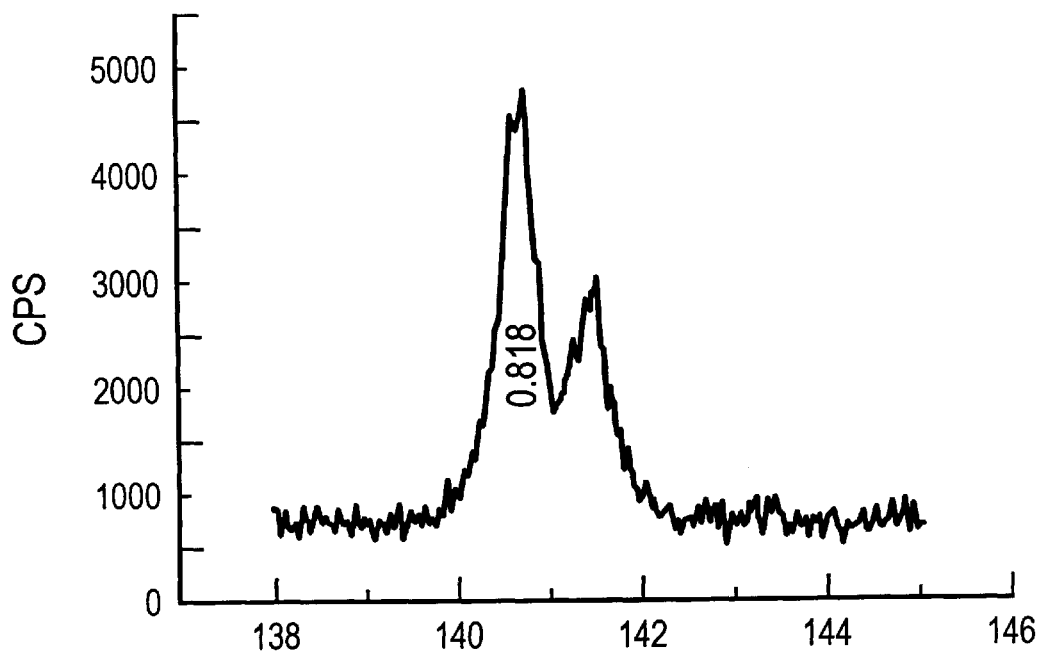
FIG. 6 is a profile of the 331 line and showing $Ka_1$ and $Ka_2$ peaks.

The intensities of the X-ray lines and the linewidths change from sample to sample. One sample showed a well-resolved K$\alpha_1$, K$\alpha_2$ doublet even for the 331 reflection. This is clearly illustrated in FIG. 6 which is a profile of the 331 line which shows both K$\alpha_1$ and K$\alpha_2$ peaks. The other samples show one broad peak instead. The profile of X-ray diffraction lines depends on many factors like grain size, lattice distortion, instrumental broadening and others. In the particular case of the studied films, lattice distortion is a primary factor contributing to the observed broadening. Such lattice distortion results in displacement disorder of atoms from the cubic-lattice positions. In the case of the sample which shows K$\alpha_1$, K$\alpha_2$ resolution it may be said that the width of the 331 diffraction line is relatively small. This measurement together with the record of five diffraction lines indicates that long-range order of atoms exists in the lattice of diamond crystals. The other samples have larger shifts of atoms from the lattice positions.

TABLE I $d_{hkl}$ interplanar distances in Å

| hkl | Calculated for a = 3.5670 Å | Measured for QQC film |
|---|---|---|
| 111 | 2.059 | 2.057 |
| 220 | 1.261 | 1.261 |
| 311 | 1.075 | 1.076 |
| 400 | 0.8917 | 0.8914 |
| 331 | 0.8183 | 0.8181 |

Figure 7:
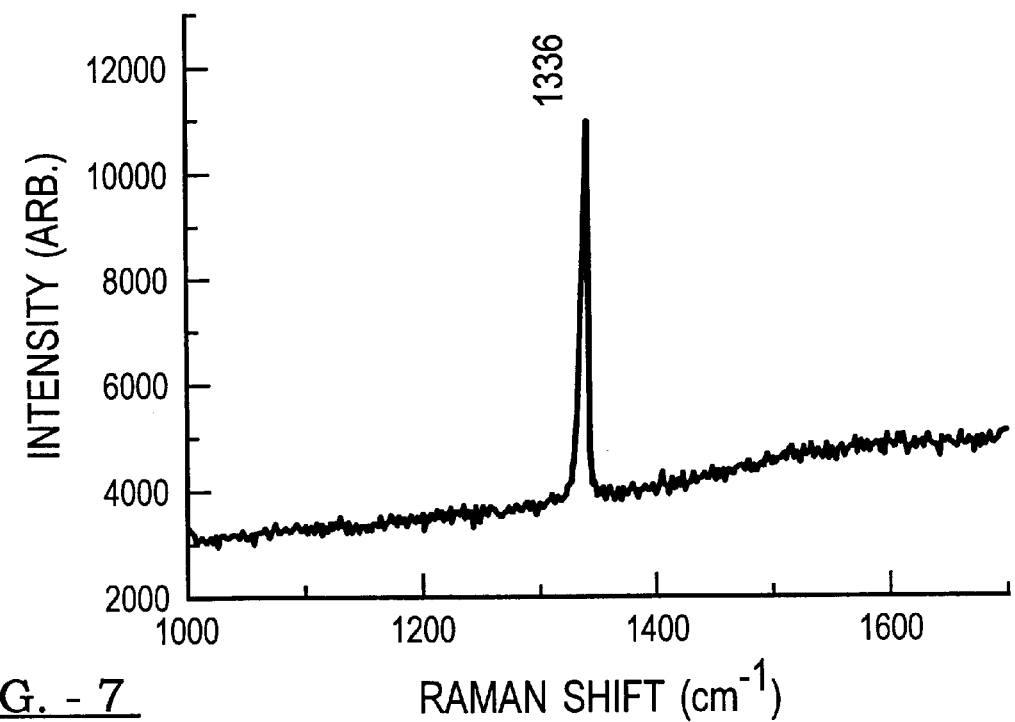
FIG. 7 is a Raman spectrum of diamond film for 514.5 nm excitation.
Figure 8:
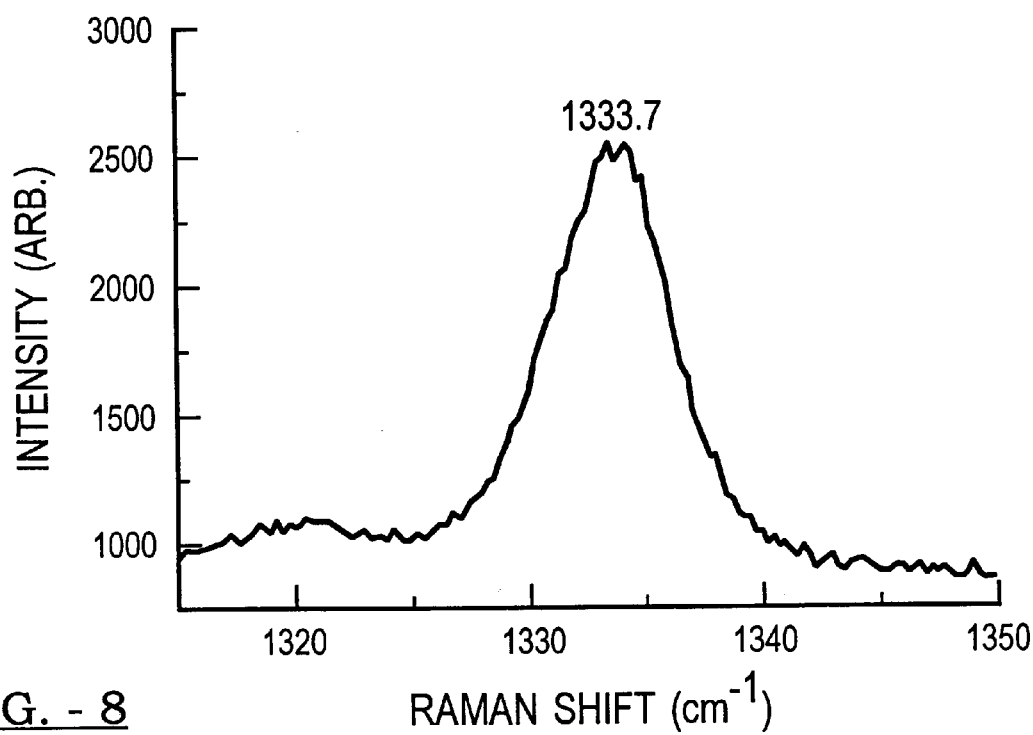
FIG. 8 is a profile of the Raman peak shown in FIG. 7.

Raman and photoluminescence spectra.—Cubic diamond has been identified in the coatings using Raman spectroscopy. This is illustrated in the Raman spectrum of diamond film of FIG. 7 which illustrates 514.5 nm excitation. The position of the diamond peak is shifted to 1336 $cm^{-1}$ indicating stress in the film. Such a shift usually appears for classical CVD diamond coatings on WC—Co. The intensity of the Raman peak for some coatings prepared according to the present method is comparable to typical CVD coatings, but other coatings prepared by the present method showed a weaker Raman peak and a broader Raman line. As illustrated in FIG. 8 which is a profile of the Raman peak shown in FIG. 7, the narrowest line full width at half maximum was 6.4 $cm^{-1}$ and the peak height to background ratio was 2.7.

Most of the studied films had a higher background which can be connected to light scattering and photoluminescence (PL). Interpretation of luminescence in diamond is a challenging issue and requires data on impurities and local changes of lattice symmetry introduced by defects. Many peaks appear and disappear as the temperature of the sample and the energy of the exciting photons change. It may safely be assumed that additional energy levels or bands are formed in the band gap as hexagonal stacking and microtwinning are introduced during the growth process. The vibronic nature of most of the diamond luminescence spectra make them signatures for identification of different forms of diamond.

Figure 9:
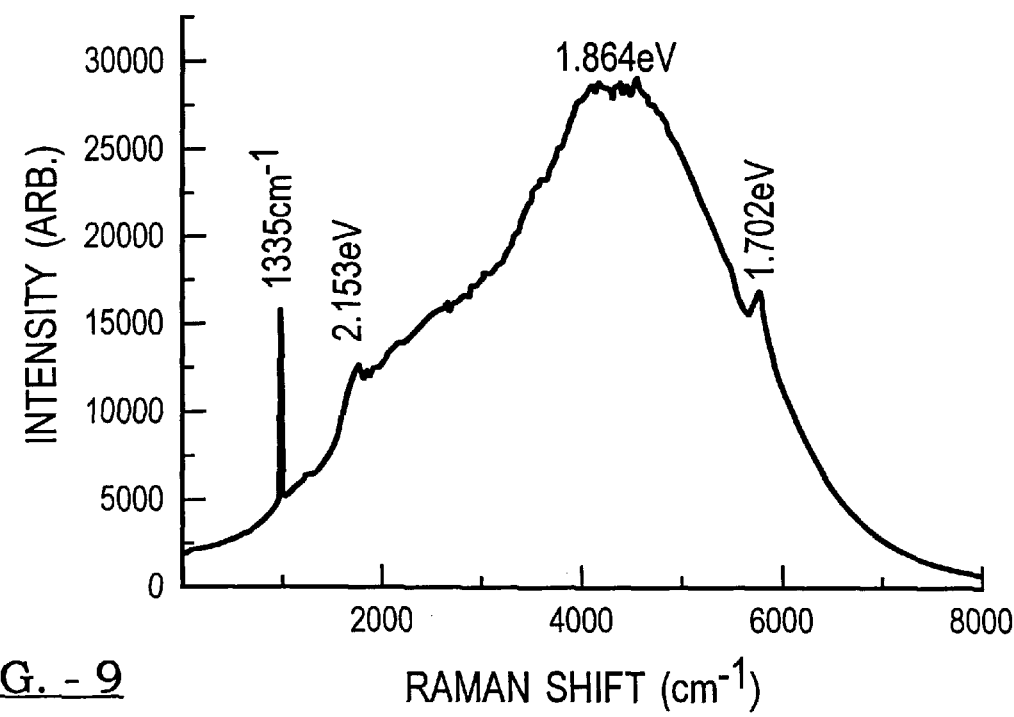
FIG. 9 is a Raman and luminescence spectrum of diamond film with the energies being assigned to the PL peaks.
Figure 10:
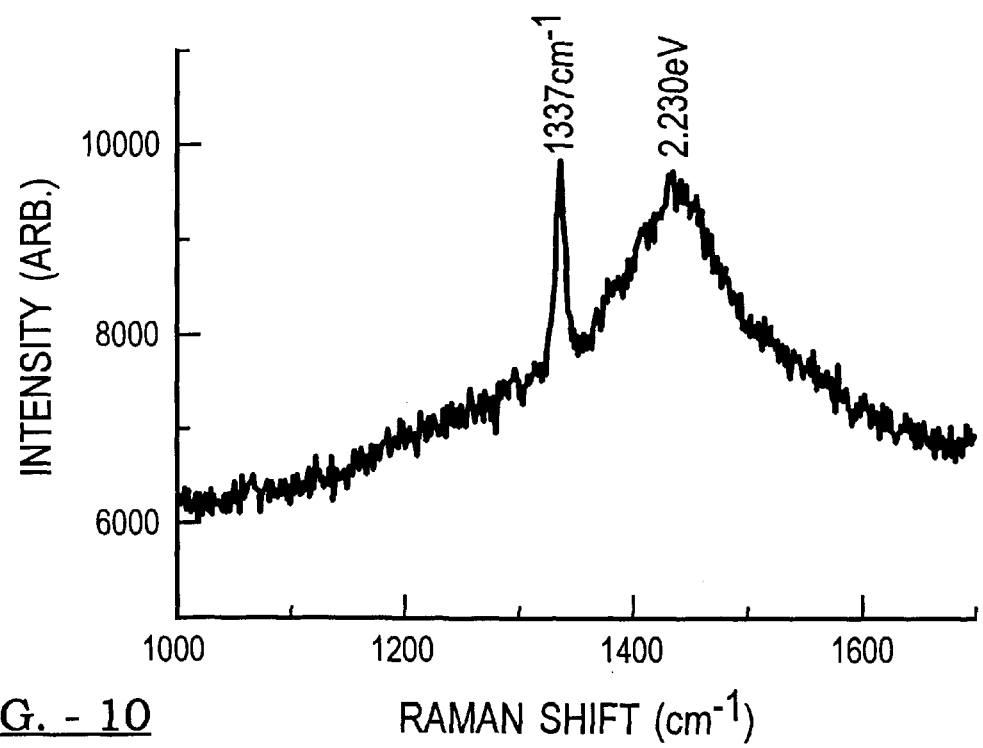
FIG. 10 is a Raman and PL spectrum of diamond film with 514.5 nm excitation and in which the indicated peak is at 1440 $cm^{-1}$ and does not shift with the excitation change as do the typical PL peaks shown in FIG. 9.

As illustrated in FIG. 9 which shows a Raman and luminescence specturm of diamond film in which the energies were assigned to the PL peaks, some PL spectra of coatings derived in accordance with the present method resemble microwave plasma CVD crystals spectra and some show new features. (For a related discussion, reference may be had to Collins A. T., Proceedings of the International School of Physics "Enrico Fermi" Course CXXXV, A. Paoletti and A. Tucciarone (Eds.), IOS Press, Amsterdam (1997), p. 273, FIG. 9.) For example, and with reference to FIG. 10 which illustrates a Raman and PL spectrum of diamond film at 514.5 nm excitation, the spectrum shown with the $1440^{-1}$ cm peak is typical for CVD diamonds grown with $O_2$ addition to a $CH_4/H_2$ plasma. The peak does not shift with the excitation change as do the typical PL peaks shown in FIG. 9. (See also Badzian A. and Badzian T., *Int. J. Refract. Metals Hard Mater.*, 15 (1997) 3.) These diamonds differ from cubic diamond because of the high density of microtwinning and a new X-ray diffraction line 2.12 Å. In the extreme case no 1332 $cm^{-1}$ Raman peak is observed. The spectrum of the film of the sample prepared according to the present method corresponds to an intermediate situation of coexistence of cubic diamond and microtwin regions.

Figure 11:
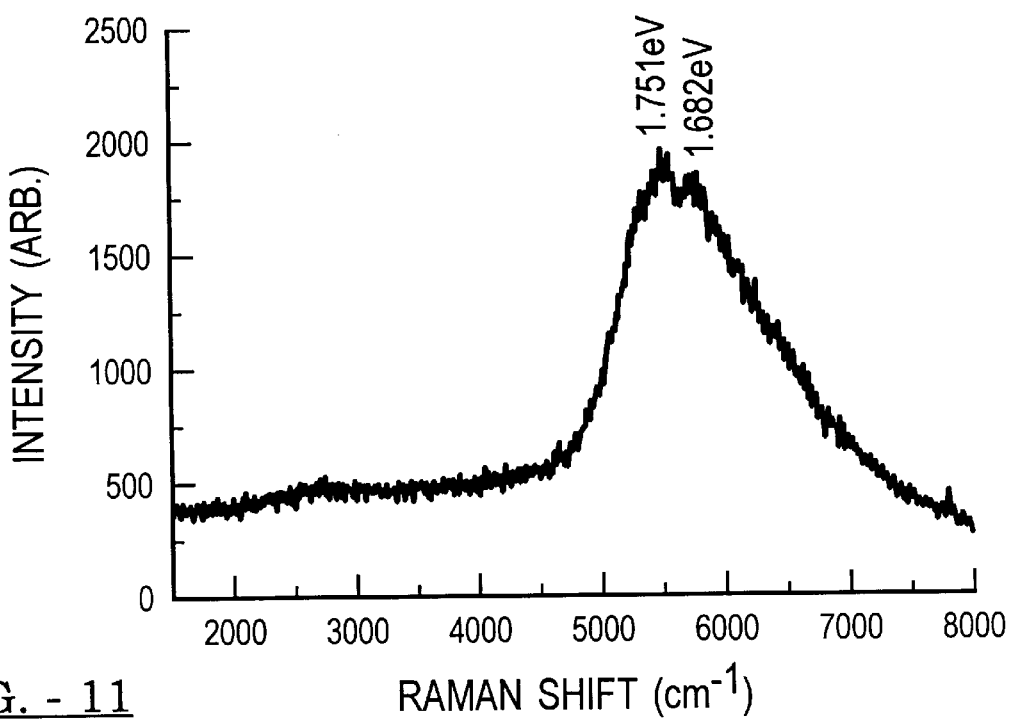
FIG. 11 is a PL spectrum taken from a square facet.
Figure 12:
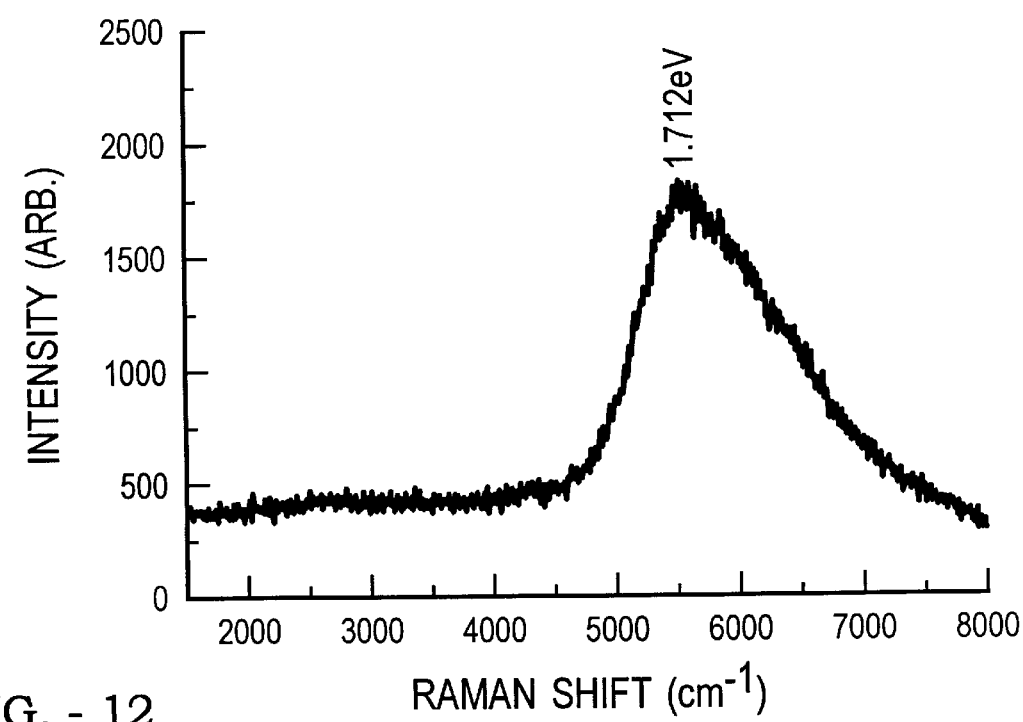
FIG. 12 is a PL spectrum taken from a triangular facet.

A new PL feature is shown in FIG. 11 which illustrates a PL spectrum taken from a square facet. A broad band appeared at 1.712 eV. This band resolves into two peaks when the PL measurement is taken on a square face, contrary to the triangular facet illustrated in FIG. 12. The peak usually assigned to a neutral vacancy also appears for films produced in accordance with the present method. The PL peak for the vacancy-Si atom(s) complex is also located close to it.

Presently such features in PL provide identification of forms of diamond rather than give us any insight into the atomic structure of defects. Typically, natural and HP/HT crystals show no spectral features when measurements are conducted with Raman spectroscopy.

Summary

In conclusion, diamond crystals prepared in accordance with the present method have high background and many PL features. It is believed that the diamond growth process demonstrated by the present method may be characterized as a hydrogen-free, high-temperature, metal-vapor-assisted deposition process. To follow are several prerequisites for the laser plasma process which are already known from the study of microwave plasma and other CVD processes.

Hydrogen free diamonds are produced easily by the Fedoseev-Derjaguin process.

Hydrogen-free formation of diamonds has also been observed during attempts on synthesis of "carbon nitride" using microwave nitrogen plasma. Only small amounts of disordered diamond particles were produced this way. Nanosize diamond particles, embedded in C—N films fabricated by magnetron sputtering, have been identified by lattice imaging. (Consider, for example, Sjostrom H., *Thin Films of Amorphous Carbon and Carbon Nitride,* Linkoping University Dissertations NO. 401, Linkoping, Sweden, 1995, p. 79.) This evidence also indicates that diamonds can be grown in the absence of hydrogen.

High-temperature, up to 1700° C., growth of diamond has been established by Fedoseev et al. referenced above and study confirmed that the CVD process works up to the temperature corresponding to the conversion of diamond to graphite at 1800° C.

From extensive work on the low-pressure solid-state source (LPSS) process it is known that metal species in the liquid and vapor are involved in diamond growth. Diamond and carbides grow simultaneously during these processes.

Diamonds have been grown from C—H—O and C—H—N gas systems. This means that both O and N can be involved in growth process.

The oxyacetylene flame process is the closest in chemical analogy to the present process working in open air. The process of combustion in air has an extensive literature and it would be useful to look into the reactions already established like "prompt NO" reactions which are involved in formation of atomic nitrogen and oxygen. (See Miller J. A. and Bowman C. T., *Prog. Energy Combustion Sci.,* 15 (1989) 287.)

The process of the present invention produced excellent well-crystallized adherent diamond layers on WC—Co substrates. The multiplexed lasers create a unique plasma as the intermediary state from which diamonds form at a rapid rate. The present process is the first laser-induced plasma deposition process which shows substantial macroscopic growth of crystals. Diamond crystals grow by a step flow mechanism as in some CVD processes. Such phenomena have not been observed for laser deposition processes.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A method for forming a diamond coating on a substrate consisting of WC—Co, the method including the steps of:
    forming a sample preparation station including a substrate support, an array of lasers and at least two gas outlets disposed about said substrate support, said array of lasers being taken from one or more of the group consisting of an excimer laser, a YAG:Nd laser, and a $CO_2$ laser;
    placing said substrate on said substrate support;
    exposing said substrate to a gas environment from said at least two gas outlets, said gas environment being selected from the group consisting of $N_2$ gas and $CO_2$ gas; and
    activating said array of lasers to create a plasma about said substrate.

2. The method of claim 1, wherein said array of lasers includes at least two excimer lasers.

3. The method of claim 1, wherein one of said gas outlets is connected to a source of $N_2$ gas and the other of said gas outlets is connected to a source of $CO_2$ gas.

4. The method of claim 1, wherein said plasma is formed a few mm about an insert.

5. The method of claim 1, wherein the duration of the deposition process is about 40 seconds.

6. The method of claim 1, wherein the resulting diamond coating is in the range of between 20 and 40 $\mu$m thick.

7. The method of claim 1, wherein the coating grows vertically at the rate of about 1 $\mu$m/s.

8. A method for forming a diamond coating on a substrate consisting of WC—Co, the method including the steps of:
    forming a sample preparation station including a substrate support, an array of lasers and at least two gas outlets disposed about said substrate support, said array of lasers being taken from one or more of the group consisting of an excimer laser, a YAG:Nd laser, and a $CO_2$ laser;
    providing a first source of gas connected to one of said at least two gas outlets;
    providing a second source of gas connected to the other of said at least two gas outlets, said each of said gases being different from the other, one of said gas outlets being connected to a source of $N_2$ gas and the other of said gas outlets being connected to a source of $CO_2$ gas;
    placing said substrate on said substrate support;
    exposing said sample substrate to a gas environment comprised of said $N_2$ gas and said $CO_2$ gas;
    activating said array of lasers to create a plasma about said substrate; and
    allowing said substrate to be exposed to said plasma for a selected duration.

9. The method of claim 8, wherein said array of lasers includes at least two excimer lasers.

10. The method of claim 8, wherein said array of lasers includes an excimer laser, a YAG:Nd laser, and a $CO_2$ laser.

11. The method of claim 1, wherein said plasma is formed a few mm about an insert.

12. The method of claim 1, wherein the duration of the deposition process is abort 40 seconds.

13. The method of claim 8, wherein the resulting diamond coating is in the range of between 20 and 40 $\mu$m thick.

14. The method of claim 8, wherein the coating grows vertically at the rate of about 1 $\mu$m/s.

15. A method for forming a diamond coating on a substrate consisting of WC—Co, the method including the steps of:
    forming a sample preparation station including a substrate support, an array of lasers and at least two gas outlets disposed about said substrate support, said array of lasers being taken from one or more of the group consisting of an excimer laser, a YAG:Nd laser, and a $CO_2$ laser;
    providing a first source of gas connected to one of said at least two gas outlets;
    providing a second source of gas connected to the other of said at least two gas outlets, said each of said gases being different from the other, one of said gas outlets being connected to a source of $N_2$ gas and the other of said gas outlets being connected to a source of $CO_2$ gas;
    placing said substrate on said substrate support;
    exposing said substrate to a gas environment comprised of said $N_2$ gas and said $CO_2$ gas;
    activating said array of lasers to create a plasma about said substrate; and
    allowing said substrate to be exposed to said plasma for a selected duration, whereby said coating grows vertically at a rate of about 1 $\mu$m/s.

16. The method of claim 15, wherein said array of lasers includes at least two excimer lasers.

17. The method of claim 15, wherein said array of lasers includes an excimer laser, a YAG:Nd laser, and a $CO_2$ laser.

18. The method of claim 15, wherein said plasma is formed a few mm from said substrate.

19. The method of claim 15, wherein the duration of the coating process is about 40 seconds.

* * * * *